(12) United States Patent
Kaelberer et al.

(10) Patent No.: US 8,298,962 B2
(45) Date of Patent: Oct. 30, 2012

(54) DEVICE MADE OF SINGLE-CRYSTAL SILICON

(75) Inventors: Arnd Kaelberer, Schlierbach (DE);
Helmut Baumann, Gomaringen (DE);
Roland Scheuerer, Reutlingen (DE);
Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 24 days.

(21) Appl. No.: 12/892,008

(22) Filed: Sep. 28, 2010

(65) Prior Publication Data

US 2011/0014794 A1   Jan. 20, 2011

Related U.S. Application Data

(62) Division of application No. 12/215,655, filed on Jun. 27, 2008, now Pat. No. 7,834,452.

(30) Foreign Application Priority Data

Jul. 6, 2007   (DE) .......................... 10 2007 031 549

(51) Int. Cl.
*H01L 21/302* (2006.01)
*H01L 21/461* (2006.01)
*H01L 23/58* (2006.01)

(52) U.S. Cl. ................. 438/753; 257/633; 257/E21.219

(58) Field of Classification Search .................... None
See application file for complete search history.

(56) References Cited

U.S. PATENT DOCUMENTS

| | | | |
|---|---|---|---|
| 3,765,969 A * | 10/1973 | Kragness et al. ............ 438/753 |
| 4,494,303 A | 1/1985 | Celler et al. |
| 4,989,063 A * | 1/1991 | Kolesar, Jr. ................... 257/633 |
| 5,814,885 A | 9/1998 | Pogge et al. |
| 5,978,441 A | 11/1999 | Early |
| 5,998,868 A | 12/1999 | Pogge et al. |
| 6,002,202 A | 12/1999 | Meyer et al. |
| 6,087,199 A | 7/2000 | Pogge et al. |
| 6,123,861 A | 9/2000 | Santini et al. |
| 6,333,553 B1 | 12/2001 | Pogge |
| 7,114,312 B2 | 10/2006 | Coppeta et al. |
| 7,413,846 B2 | 8/2008 | Maloney et al. |
| 7,978,388 B2 * | 7/2011 | Uchiyama et al. ......... 359/199.2 |
| 2004/0026360 A1 * | 2/2004 | Yotsuya et al. ................. 216/12 |
| 2008/0115361 A1 | 5/2008 | Santini et al. |

* cited by examiner

*Primary Examiner* — Fernando L Toledo
*Assistant Examiner* — Valerie N Brown
(74) *Attorney, Agent, or Firm* — Kenyon & Kenyon LLP

(57) ABSTRACT

A device made of single-crystal silicon having a first side, a second side which is situated opposite to the first side, and a third side which extends from the first side to the second side, the first side and the second side each extending in a 100 plane of the single-crystal silicon, the third side extending in a first area in a 111 plane of the single-crystal silicon. The third side extends in a second area in a 110 plane of the single-crystal silicon. Furthermore, a production method for producing a device made of single-crystal silicon is described.

4 Claims, 3 Drawing Sheets

DEVICE MADE OF SINGLE-CRYSTAL SILICON

RELATED APPLICATION INFORMATION

This application is a divisional application of U.S. patent application Ser. No. 12/215,655, filed Jun. 27, 2008, now U.S. Pat. No. 7,834,452 which claims the benefit of and priority of German Patent Application No. 10 2007 031 549.1, which was filed in Germany on Jul. 6, 2007, the entire contents of all of which are expressly incorporated herein by reference.

FIELD OF THE INVENTION

The present invention is directed to a device made of single-crystal silicon having a first side, having a second side which is situated opposite to the first side, having a third side which extends from the first side to the second side, the first side and the second side each extending in a 100 plane of the single-crystal silicon, and the third side extending in a first area in a 111 plane of the single-crystal silicon.

BACKGROUND INFORMATION

In KOH-etching of 100 silicon material, the crystallographic properties of the silicon wafer are exploited to etch precisely rectangular openings in the wafer surface. Vertical walls do not arise in the depth, but rather inclined flanks having an angle of 54.7°. This property is also a crystallographic property of the 100 wafer material. The inclined flanks correspond to the 111 planes and actually have an etching stop character in KOH. The 111 planes have the lowest etching rates in silicon crystal by far and may thus be used to provide well-defined openings having defined inclined walls.

In KOH etching starting from one side of the silicon wafer, walls having an angle of 54.7° to the 100 plane always result in the depth. Steeper flanks may thus not be implemented from a crystallographic viewpoint.

However, it is desirable in some micromechanical structures to have the steepest possible flanks to obtain the greatest possible mechanical stability, or, for example, to be able to place cap wafers having the largest possible bond area as close as possible to bond pads.

SUMMARY

The present invention is directed to a device made of single-crystal silicon having a first side, a second side which is situated opposite to the first side, a third side which extends from the first side to the second side, the first side and the second side each extending in a 100 plane of the single-crystal silicon, the third side extending in a first area in a 111 plane of the single-crystal silicon. In accordance with the present invention, the third side extends in a second area in a 110 plane of the single-crystal silicon. The third side, thus, advantageously has an area which extends perpendicularly to the first and second sides. A third side (flank) is advantageously, thus, provided which is steeper than a conventional third side, which extends only along the 111 plane.

According to an advantageous embodiment of the device according to the present invention, the third side extends in a third area in a 111 plane of the single-crystal silicon, the second area being situated between the first area and the third area.

According to an advantageous embodiment of the device according to the present invention, the device has a through opening from the first side to the second side, and the third side is a side wall of the through opening. The device may advantageously, thus, have trenches or holes having steep side walls (flanks).

It may also be advantageous if the through opening has a first opening width on the first side and a second opening width on the second side, the first opening width is greater than the second opening width, and the second opening width is greater than that predefined by a thickness of the device between the first side and the second side and the angle of the 111 plane of the single-crystal silicon starting from the first opening width. The second opening width is advantageously greater than an opening width which would result on the second side if, starting from a through opening on the first wafer side and in consideration of the angle of the 111 etch stop plane to the 100 plane, a 100 silicon wafer having defined thickness was etched through using KOH etching.

Furthermore, the present invention relates to a production method for producing a device made of single-crystal silicon, including the following production steps:

Supplying a substrate made of single-crystal silicon having a first side, having a second side, which is situated opposite to the first side, the first side and the second side each extending in a 100 plane of the single-crystal silicon, the substrate having a thickness between the first side and the second side.

Providing a first mask, having a first opening with a first opening width, on the first side of the substrate.

Providing a second mask, having a second opening, with a second opening width, on the second side of the substrate, the first opening and the second opening being situated opposite to one another, the first opening width being greater than the second opening width, and the second opening width being greater than that predefined by the thickness of the substrate and the angle of the 111 plane of the single-crystal silicon starting from the first opening width.

KOH etching of the substrate from the first and the second side, a third side being formed, which extends from the first side to the second side, the third side extending in a first area in a 111 plane of the single-crystal silicon and in a second area in a 110 plane of the single-crystal silicon.

Through the 2-mask process according to the present invention having KOH etching on both sides, it is possible to produce a third side (etching flank) having a greater slope than in the related art. As a result of the production method, the etching flank no longer extends only along the 111 plane of the silicon substrate, but rather partially also along the 110 plane, i.e., perpendicular to the first and second sides, which extend in the 100 plane. An etching flank having a greater slope thus results on average.

According to an advantageous embodiment of the production method according to the present invention, a third side is formed in the KOH etching production step which extends in a third area in a 111 plane of the single-crystal silicon, the second area being situated between the first area and the third area.

According to an advantageous embodiment of the production method according to the present invention, the KOH etching of the substrate occurs simultaneously from the first and the second sides. According to another advantageous embodiment of the production method according to the present invention, the KOH etching of the substrate occurs at different times from the first and the second sides. The flank design may advantageously be controlled by the selection of the particular etching start time and the particular etching times.

By using the "2-mask technique" in the production of KOH-etched passages in a 100 wafer, it is, thus, possible to be able to implement steeper flanks in silicon wafers, which have only the special feature of not forming a continuous level face. Instead, they have a stepped face having an alternating slope, namely having the angles of the 111 and the 110 planes.

Through openings having flanks having an adjustable slope may advantageously be provided by the present invention in such a way that the slope of the flanks generally corresponds to the profile of a bond wedge for the wire bonding, so that the bond wedge may be received with good fitting precision in the through opening. The flank design according to the present invention ensures that the largest possible bonding surface may be combined with the greatest possible mechanical stability of the structure around the through opening.

DETAILED DESCRIPTION OF EXAMPLE EMBODIMENTS

Figure 1:
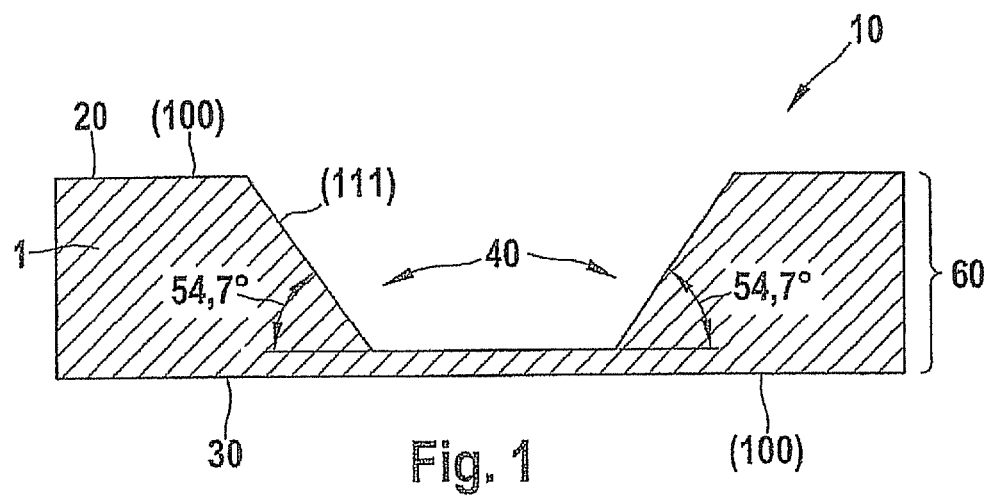
FIG. 1 shows a conventional device made of single-crystal silicon.

FIG. 1 shows a conventional device made of single-crystal silicon. A micromechanical device 10, including a single-crystal silicon substrate 1, is shown. Micromechanical device 10 has a first side 20 and a diametrically opposite second side 30, which are situated in crystallographic 100 planes of single-crystal silicon substrate 1. Micromechanical device 10 has a thickness 60 between first side 20 and diametrically opposite second side 30. A recess is etched in micromechanical device 10 using KOH from first side 20. The recess may be, as shown, a pocket hole or a through opening (not shown here) from first side 20 to second side 30. A third side 40 is thus provided, which extends from first side 20 to second side 30.

During KOH etching of 100 silicon material, the crystallographic properties of the silicon wafer are exploited to etch precisely rectangular openings in the wafer surface. During the KOH etching, vertical walls do not form in the depth, but rather inclined flanks having an angle of 54.7°. This property is also a crystallographic property of the 100 wafer material. The inclined flanks correspond to the 111 planes and have an etch stop character during the etching in KOH. The 111 planes have the lowest etching rates in silicon crystal by far and may thus be used for well-defined openings having defined inclined walls.

Third side 40 therefore runs along a crystallographic 111 plane of single-crystal silicon substrate 1. This plane has an angle of 54.7° to the 100 plane. Steeper flanks may thus not be implemented from a crystallographic viewpoint.

Figure 2:
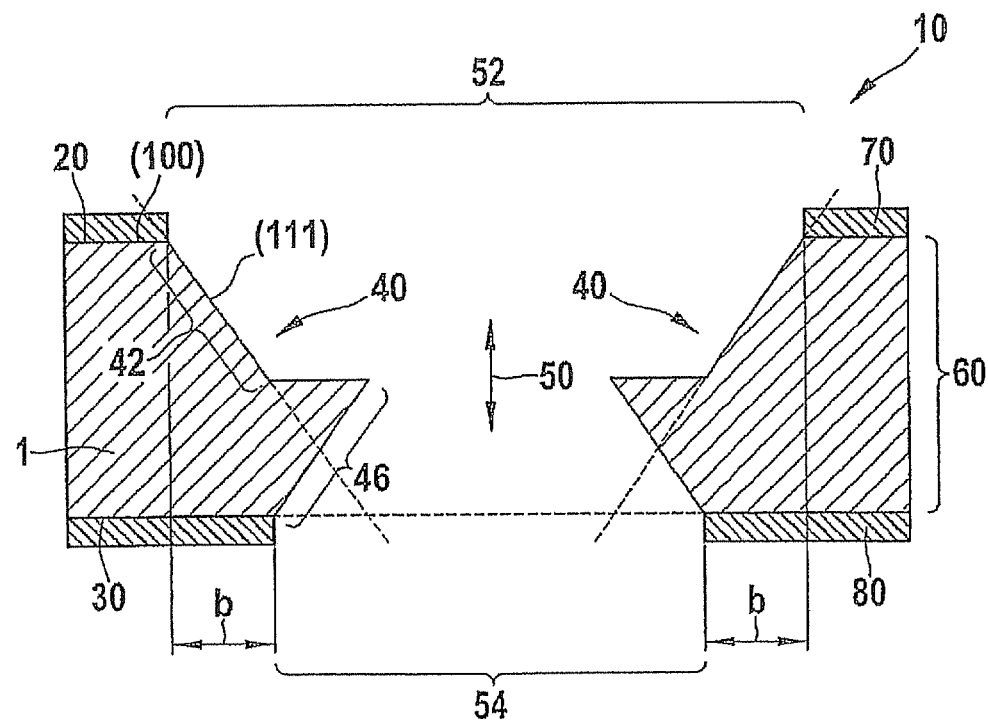
FIG. 2 shows a preform of a device according to the present invention made of single-crystal silicon.

FIG. 2 shows a preform of an example device according to the present invention made of single-crystal silicon. A third side 40 running at a steeper angle than the 54.7° cited may be achieved, i.e., a steeper flank of the through opening, by a 2-mask KOH etching process according to the present invention, in which a 100 wafer is etched through from both sides. For this purpose, a first mask 70, having a first opening with a first opening width 52, is applied to first side 20 of silicon substrate 1. A second mask 80, having a second opening with a second opening width 54, is applied to diametrically opposite second side 30 of silicon substrate 1. First and second masks 70, 80 are situated diametrically opposed and must have a defined overlap in a top view. KOH is then used for etching from both sides. FIG. 2 shows the state of micromechanical device 10 briefly after etching through silicon substrate 1 (e.g., a wafer). As a result of the KOH etching, a through opening 50 is provided, which is delimited laterally by third sides 40. Through opening 50 has a first opening width 52 on first side 20 of micromechanical device 10 and a second opening width 54 on second side 30. Distance "b" identifies the overlap of first and second masks 70 and 80 here. Third sides 40 each have a first area 42 starting from first side 20 which, as is conventional, runs along the 111 plane. Third sides 40 also each have a tip in the profile shown which is made up of one edge along a 100 plane and a third area 46 along a further 111 plane as in first area 42 only having a reversed sign of the angle.

Figure 3:
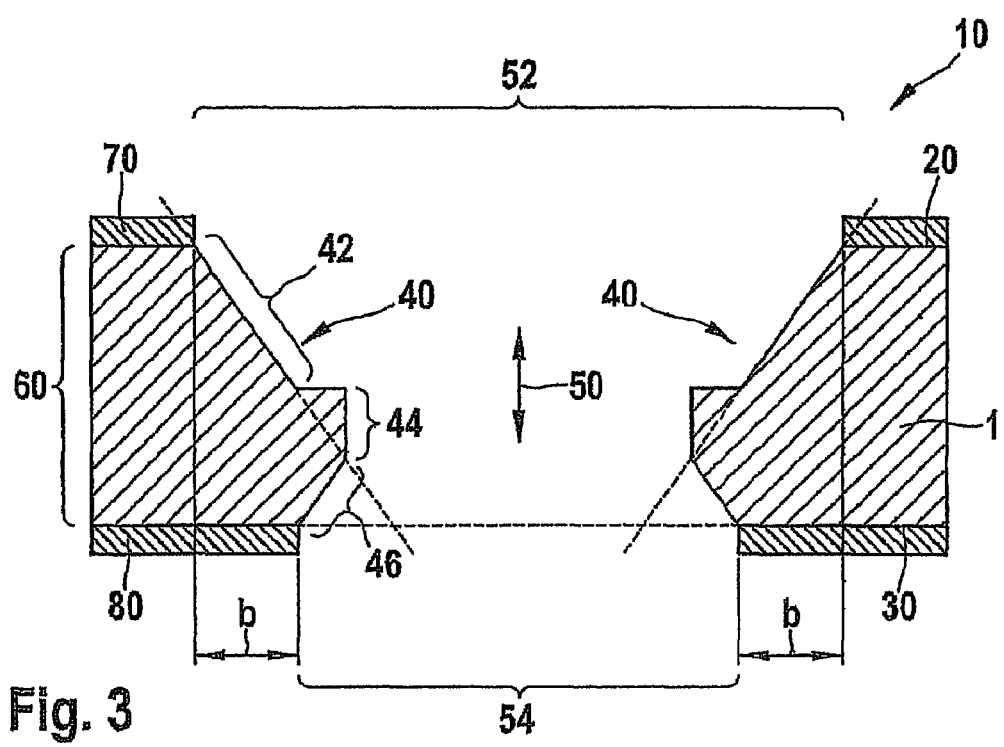
FIG. 3 shows a first embodiment of a device according to the present invention made of single-crystal silicon.

FIG. 3 shows a first embodiment of a device according to the present invention made of single-crystal silicon. During the progress of KOH etching over time, an etching front additionally arises, starting from the formed silicon tip, and is displaced forward in the 110 direction into silicon substrate 1. This 110 plane perpendicular to the 100 plane forms a second area 44 and travels ever further into silicon substrate 1 with progressing etching time.

Figure 4:
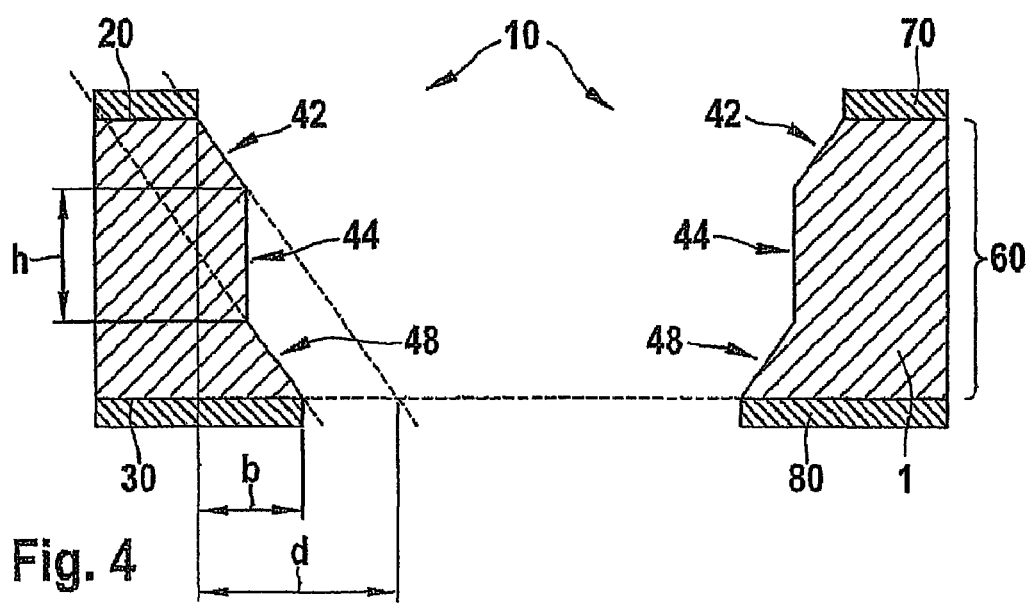
FIG. 4 shows a second embodiment of a device according to the present invention made of single-crystal silicon.

FIG. 4 shows a second embodiment of the device according to the present invention made of single-crystal silicon. This is achieved by continued KOH etching. Second area 44, which is situated in the 110 plane, is incident on an edge of second mask 80. Third area 46, which is situated in the 111 plane described above, is no longer present at this moment. Upon continued KOH etching and thus the further advance of second area 44, a third area 48 again forms which runs along the 111 plane at the same angle as first area 42. Second area 44 in the 110 plane thus forms the connection of first area 42 (of the first 111 plane), starting from first mask 70, and third area 48 (of the second 111 plane), starting from second mask 80.

Height h of second area 44 is a function of mask overlap b. The lateral position of second area 44 in the etching flank is a function of the etching time. This etching behavior is valid only for a mask overlap of b<d. The flank width projected on the x axis is referred to as d here, which would result if the wafer was completely etched through only from the front side. For values of b>d, the first 111 plane practically acts as an etch stop plane, assuming a correspondingly long KOH etching time. The shape of the through etching would then correspond to that of single-side through etching in the related art, having the known 54.7° etching flanks. In other words, first opening width 52 is greater than second opening width 54. However, second opening width 54 is greater than that predefined by thickness 60 of substrate 1 and the angle of the 111 plane of the single-crystal silicon starting from first opening width 52 on first side 20 if this 111 plane was continued up to second side 30.

In one design of the present invention, the etching flanks have a profile which is generally complementary to the profile of a bonding tool, a bonding wedge, for wire bonding. The through opening is suitable with a corresponding design of the etching flanks to receive a bonding wedge which has an angle of approximately 30°, for example, in a precisely fitted manner. A bond pad may be provided on second side 30 in the area of second opening width 54, which is connectable to a bonding wire from first side 20 using the bonding wedge (not shown).

Figure 5:
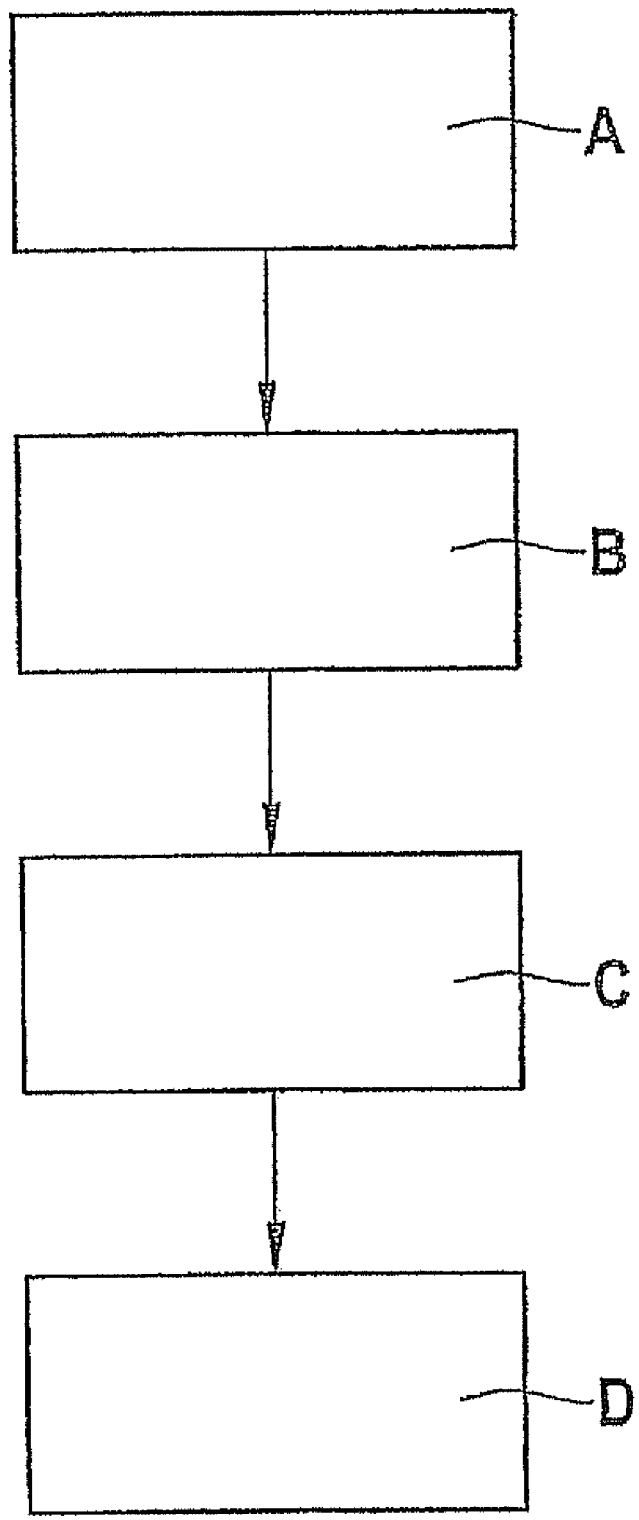
FIG. 5 shows a method according to the present invention for producing a device made of single-crystal silicon.

FIG. 5 schematically shows an example method according to the present invention for producing a device made of single-crystal silicon. The method has the following production steps:

(A) Supplying a substrate 1 made of single-crystal silicon—having a first side 20, having a second side 30, which is situated opposite to first side 20, first side 20 and second side 30 each extending in a 100 plane of the single-crystal silicon, substrate 1 having a thickness 60 between first side 20 and second side 30.

(B) Providing a first mask 70, having a first opening with a first opening width 52, on first side 20 of substrate 1.

(C) Providing a second mask 80, having a second opening with a second opening width 54, on second side 30 of substrate 1, the first opening and the second opening being situated diametrically opposite to one another, first opening width 52 being greater than second opening width 54, and second opening width 54 being greater than that predefined by thickness 60 of substrate 1 and the angle of the 111 plane of the single-crystal silicon starting from first opening width 52.

(D) KOH etching of substrate 1 from first and second sides 20, 30, a third side 40 being formed, which extends from first side 20 to second side 30, third side 40 extending in a first area 42 in a 111 plane of the single-crystal silicon and in a second area 44 in a 110 plane of the single-crystal silicon.

According to one exemplary embodiment, a third side 40 is formed in production step (D), which extends in a third area 46, 48 in a 111 plane of the single-crystal silicon, second area 44 being situated between first area 42 and third area 46, 48.

By using the "2-mask technique" in the production of KOH-etched passages in a 100 wafer, it is thus possible to be able to implement steeper flanks in silicon wafers which only have the special feature of not forming a continuously level face.

The method may also be performed in a time-controlled manner, i.e., the etching from first and second sides 20, 30 may be performed at the same time, or at different, predefinable times.

What is claimed is:

1. A method for producing a device made of single-crystal silicon, comprising:
   (A) supplying a substrate made of single-crystal silicon having a first side, and a second side which is situated opposite to the first side, the first side and the second side each extending in a 100 plane of the single-crystal silicon, the substrate having a thickness between the first side and the second side;
   (B) providing a first mask having a first opening with a first opening width, on the first side of the substrate;
   (C) providing a second mask, having a second opening with a second opening width, on the second side of the substrate, the first opening and the second opening being situated diametrically opposite to one another, the first opening width being greater than the second opening width, and the second opening width being greater than predefined by the thickness of the substrate and the angle of the 111 plane of the single-crystal silicon starting from the first opening width;
   (D) KOH etching the substrate from the first and the second sides; and
   (E) initially creating from the KOH etching a third side extending from the first side to the second side, the third side having a first area in the 111 plane of the single-crystal silicon and a second area in a 110 plane of the single-crystal silicon.

2. The method as recited in claim 1, wherein the third side extends in a third area in the 111 plane of the single-crystal silicon, the second area being situated between the first area and the third area.

3. The method as recited in claim 1, wherein the KOH etching of the substrate occurs simultaneously from the first and the second sides.

4. The method as recited in claim 1, wherein the KOH etching of the substrate occurs offset in time from the first and the second sides.

* * * * *